United States Patent [19]
Weeks

[11] Patent Number: 5,227,589
[45] Date of Patent: Jul. 13, 1993

[54] PLATED-THROUGH INTERCONNECT SOLDER THIEF

[75] Inventor: Anthony R. Weeks, Gilbert, Ariz.

[73] Assignee: Motorola, Inc., Schaumburg, Ill.

[21] Appl. No.: 812,486

[22] Filed: Dec. 23, 1991

[51] Int. Cl.⁵ .............................................. H05K 1/00
[52] U.S. Cl. ...................... 174/263; 361/400; 361/403; 228/180.1; 228/180.2; 428/901
[58] Field of Search ............... 174/260, 261, 262, 263, 174/264; 361/400, 403; 228/180.1, 180.2; 428/901

[56] References Cited

U.S. PATENT DOCUMENTS

| | | | |
|---|---|---|---|
| 4,339,784 | 7/1982 | Shearer | 361/403 |
| 4,342,977 | 8/1982 | McGalliard | 337/4 |
| 4,394,639 | 7/1983 | McGalliard | 337/292 |
| 4,767,892 | 8/1988 | Kobari | 174/68.5 |
| 4,835,345 | 5/1989 | Haarde | 361/403 X |
| 4,891,472 | 1/1990 | Beurman et al. | 174/68.5 |
| 5,010,448 | 4/1991 | Kobari | 361/403 |

Primary Examiner—Leo P. Picard
Assistant Examiner—Trinidad Korka
Attorney, Agent, or Firm—Frank J. Bogacz

[57] ABSTRACT

A plated-through hole solder thief for inhibiting solder bridges between adjacent leads of an integrated circuit and simultaneously providing for electrical interconnection of certain leads of the integrated circuit to other surfaces or layers of a printed wiring board. Plated-through holes are used as solder thieves and are located in the proximity of the last solder pad in a row of solder pads. The plated-through hole draws the solder from the last solder pad to fill the plated-through hole and inhibit bridging between functional leads of the integrated circuit as well as make an electrical interconnection between the last lead of the integrated circuit in each row and other surfaces or layers of the printed wiring board. The plated-through hole is located askew from the rows of solder pads so that functional use may be made of the plated-through hole once it is filled to provide a test point for testing the integrated circuit.

12 Claims, 3 Drawing Sheets

PLATED-THROUGH INTERCONNECT SOLDER THIEF

BACKGROUND OF THE INVENTION

The present invention pertains to printed wiring boards and more particularly to preventing solder defects from wave soldering of printed wiring boards.

Printed circuit boards (PCBs) or printed wiring boards (PWBs) are employed in the electronics industry for the placement and interconnection of electronic circuits. These electronic circuits may comprise dual in-line packages of the surface mount type or those with leads which penetrate the printed wiring board through holes or apertures in the board. These dual in-line packages whether surface-mount or hole-mount type are typically connected electrically to the printed wiring board via a mass soldering operation since there may be a great number of these DIP packages on a printed wiring board. The mass soldering process may include wave soldering applications. The dual in-line packages have two rows of closely spaced leads.

In the wave soldering process, the printed wiring board, to which the electrically components are affixed, is drawn or pulled through a wave of solder. The components are affixed to the board by gluing surface-mounted devices and by inserting hole-mount devices into the appropriate holes in the printed wiring board. The printed wiring board has previously been affixed with solder pads in the case of surface-mount components or solder pads surrounding the holes in which the components have been placed. The printed wiring board is pulled through a wave of solder which covers the components and causes the solder pads to be reflowed to make electrical connection between the printed wiring board and the electrical circuit components (DIPs). As the printed wiring board is drawn through the solder wave, solder bridges are formed between the last two leads of each row of leads. Such solder bridges provide a short circuit between these leads and are therefore defects.

For DIP packages which are inserted through holes in the PWB, it has been found that adding an extra solder pad in-line at the end of each line of leads for the DIP package causes the solder in the wave soldering process to be drawn to the extra solder pad and form a bridge between the last functional lead in each line of leads and the functionally useless extra solder pad.

What is needed is a solder thief for preventing bridging between leads of dual in-line packages while providing electrical interconnection of these leads to other layers or surfaces of the printed wiring board.

SUMMARY OF THE INVENTION

In accordance with the present invention, a novel solder thief interconnection is shown.

A printed wiring board has a plurality of solder pads arranged in at least one row. A plated-through hole is located at one end of each row of solder pads and askew to the row. As the printed wiring board is drawn through a wave soldering machine, the plated-through hole draws the solder from the last solder pad to prevent bridging between other solder pads and simultaneously connects the last solder pad to other surfaces or layers of the printed wiring board.

DESCRIPTION OF THE PREFERRED EMBODIMENT

Figure 1:
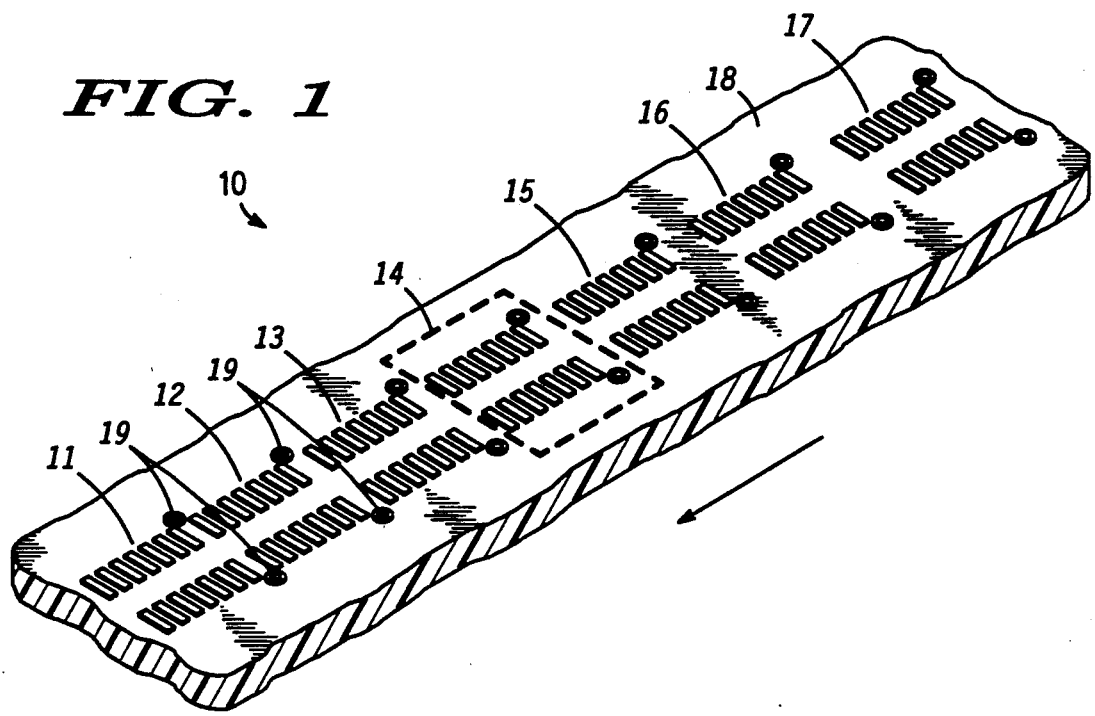
FIG. 1 is an isometric view of a printed wiring board in accordance with the present invention.

FIG. 1 depicts an isometric view of a portion of a printed wiring board (PWB) 10 prepared for surface-mount integrated circuits in accordance with the present invention. On the top surface 18 of PWB 10 are shown groups of solder mounting pads 11 though 17 for surface mounting of integrated circuits. The printed wiring board 10 is prepared for soldering by having solder pads deposited upon the top surface 18 of PWB 10. Each group of pads 11, 12, 13, 14, etc., will support the mounting and electrical interconnection for one surface-mount type integrated circuit. These integrated circuits have their connections leads mounted in two aligned rows of seven pads per row. Although seven pads per row are shown and discussed, it will be readily understood by those of ordinary skill in the art that this technique will apply to mounting of integrated circuits which have as little two interconnection leads per row or a great many leads per row. The arrow indicates the direction of movement of the printed wiring board through the wave solder machinery. The direction of movement will be from pad group 11 to 12 to 13 to 14 and so on. With respect to the movement through the wave solder machine, it is to be noted that at the end of each set of solder pads a hole or aperture is shown. These holes are plated-through holes. That is, these holes make electrical contact from the top surface 18 to the bottom surface (not shown) and may be interconnected to conductive paths on layers between top surface 18 and the bottom surface.

Plated-through holes 19 are in close proximity to the last pad of each pad group. The plated-through holes 19 are not in direct line or contrast with the rows of pads. These plated-through holes are substantially askew with respect to the last pad of each group. The plated-through hole 19 is not in contact with the solder pads at the end of each group of pads. However, as the printed wiring board 10 is drawn through the wave soldering machinery, a solder bridge is permitted to occur between the last pad of each group and the plated-through hole 19 filling-in hole 19. Thus, plated-through hole 19 serves several functions. First, a solder bridge is allowed to occur between the last pad of each row and the plated-through hole 19. Without plated-through 19, solder bridges would occur between the last pad and next to last pad of the integrated circuit mounting. This would result in a short circuit between these integrated circuit leads and be a defect which would render the circuitry inoperable. Second, the plated-through hole provides the advantage of having an electrical connection from the top surface 18 of the printed wiring board to the bottom surface or intermediate interconnection layers (not shown). Third, once the plated-through hole 19 has drawn solder from the last solder pad, it can provide external test point for observing the functionality of the respective integrated circuit. The plated-through holes draw the solder from the last solder pad and as a result become completely filled-in with solder to make a solid electrical connection.

Further, this plated-through hole arrangement provides for denser component mounting because the plated-through hole 19 is not directly in lines with the solder pads, but are askew, that is, off-line with respect to the solder pad rows. Prior art systems teach providing extra pads directly in line with the rows of solder pad connections. Such prior art arrangements are inefficient since they take more surface area of the PWC than the present invention.

Figure 2:
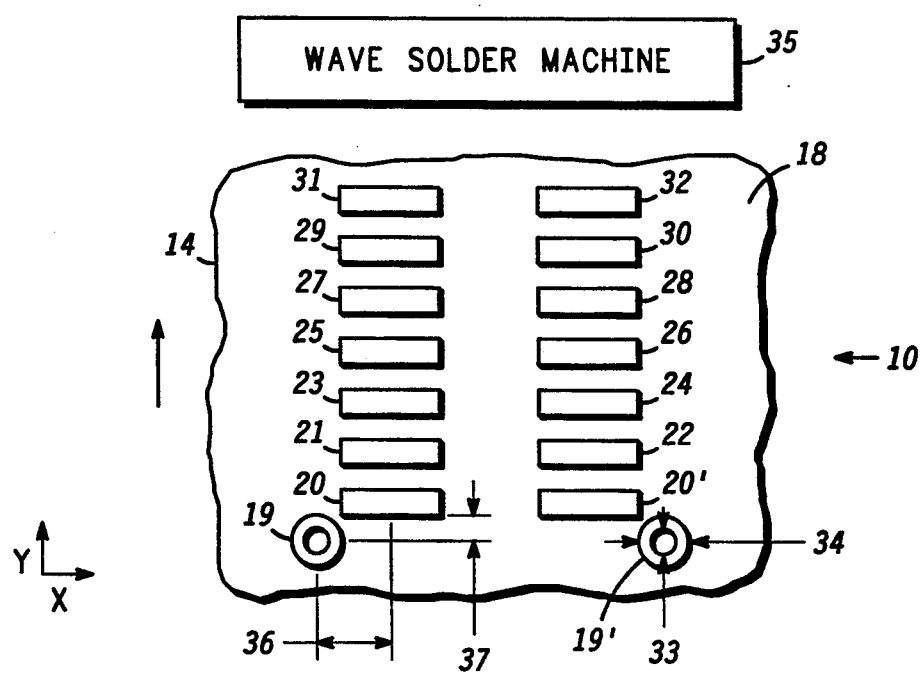
FIG. 2 is a schematic diagram of the solder pads of one integrated circuit entering a wave solder machine as shown in FIG. 1.

FIG. 2 depicts one of the solder pad groups 14 as shown in FIG. 1. Shown are 14 solder pads 20, 20' and 21 through 32 located in two rows upon the surface 18 of PWC 10. PWB 10 is moving through the wave solder machine 35 in the direction indicated by the arrow. In so doing, each of the pads 32 through 20 and 20' are soldered in turn. If plated-through holes 19 and 19' were not in place, as solder pads 20 and 20' moved through the solder, the solder would draw between pads 20 and 21 and 20' and 22. These pads would become shorted with respect to one another, that is pads 20 and 21 would be shorted and pads 20' and 22 would be shorted together electrically. As a result, the functionality of the circuit would be impeded and the printed wiring board would have defects. Plated-through holes 19 and 19' are located askew with respect to the two rows of solder pads. As PWC 10 is drawn through the wave soldering machine, a bridge is formed between plated-through hole 19 and solder pad 20 and between plated-through hole 19' and solder pad 20'. Solder pads 21 and 22 do not have a solder bridge or defect as a result. This is due to the surface tension of the solder. In addition to not permitting a solder bridge between solder pads 20 and 21 and 20' and 22, plated-through holes 19 and 19' provide for electrical interconnection of solder pads 20 and 20' respectively to other layers of the printed wiring card 10 and to the bottom or other surface (not shown). Plated-through holes 19 and 19' may have an inner diameter 33 of approximately 30 mils and an outer diameter 34 of approximately 60 mils. Holes 19 and 19' are located a distance 36 on the X-axis of approximately 70 mils from the center line of solder pads 20 and 20' to the center line of holes 19 and 19'. Holes 19 and 19' are located a distance 37 on the Y-axis of approximately 30 to 120 mils from the nearest edge of solder pads 20 and 20' to the center of holes 19 and 19'. Before soldering occurs, holes 19 and 19' are not in electrical contact with solder pads 20 and 20' respectively. The spacing between the solder pad 20 and the plated-through hole 19 should be less than the spacing between adjacent solder pads 20 and 21, for example. Plated-through holes 19 and 19' in addition to providing for increased integrated circuit packaging density allow test probes to be applied as test points to test the functionality associated with pads 20 and 20' without disturbing or destroying the solder pads themselves. The space between solder pads 20 and 21, for example, is approximately 50 mils from the center of one pad to the center of the other.

Figure 3:
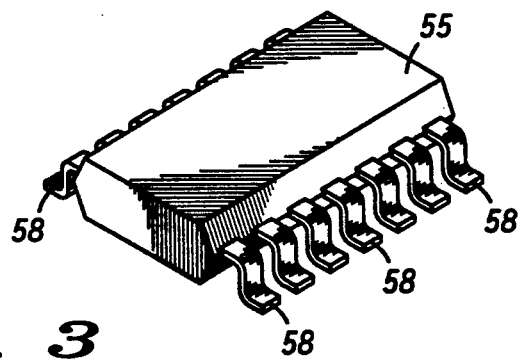
FIG. 3 is an isometric view of a dual in-line package integrated circuit suitable for surface mount in combination with the printed wiring card of FIG. 2.

Referring to FIG. 3, an isometric view of a surface-mounted integrated circuit 55 is shown. Such integrated circuits may also be termed small outline integrated circuits (SOIC). Integrated circuit 55 has leads 58 suitable for mounting on surface solder pads such as have been shown in FIGS. 1 and 2.

Figure 4:
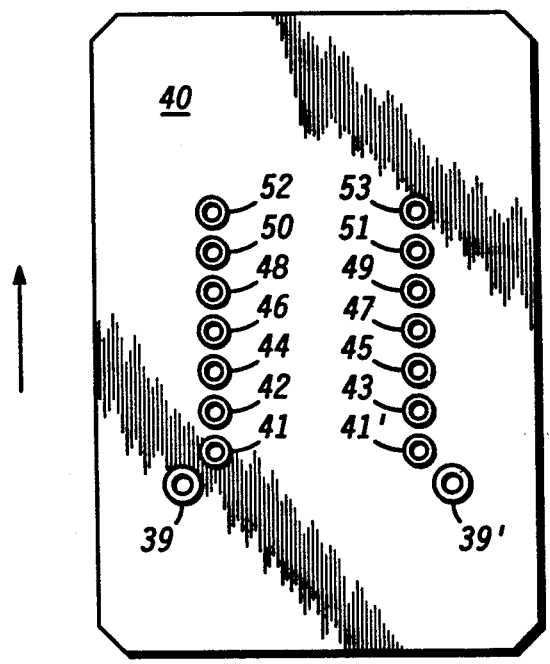
FIG. 4 is a plan of a solder pad arrangement for hole-mounted integrated circuits in accordance with the present invention.
Figure 5:
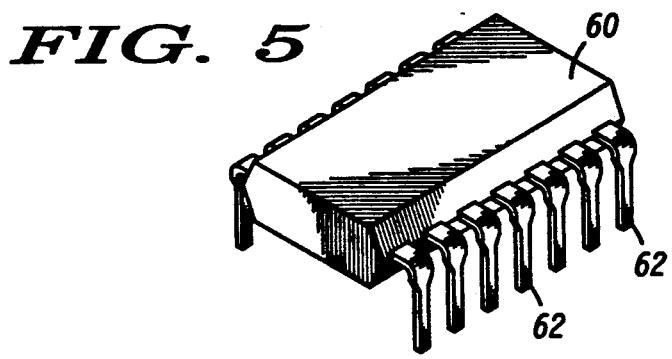
FIG. 5 is an isometric view of a hole-mounted integrated circuit for use in combination with the mounting pads shown in FIG. 4.

FIG. 4 depicts a portion of a printed wiring board 40. Shown are two rows of holes in printed wiring board 40. Included are holes 41, 41' and 42 through 53. Hole-mounted integrated circuits 60 such as the one shown in FIG. 5 and having leads 62 may be inserted into the holes 41, 41' and 42 through 53. The leads 62 of integrated circuit 60 are inserted one into each of the holes 41, 41' and 42 through 53 (as shown in FIG. 4). Thus, the integrated circuit 60 is physically mounted onto printed wiring board 40 via lead insertion into the holes. In the wave soldering process, plated-through holes 39 and 39' draw solder from hole connection pads 41 and 41' respectively. This simultaneously prevents solder bridging between leads 41 and 42 and 41' and 43 while filling-in plated-through solder thief holes 39 and 39' to make electrical contact between solder pads 41 and 41' with other layers or the other surface (not shown) of printed wiring board 40. Again, the alignment is similar to that shown in FIG. 2. Plated-through holes 39 and 39' are placed askew and at the end of an integrated circuit pad hole arrangement such as shown in FIG. 4. The arrow indicated the direction of travel of the printed wiring board 40 and mounted integrated circuit 60 as they proceed through the wave soldering machinery. Again as mentioned above, two rows of seven solder holes are shown on PWB 40 for the integrated circuit 60 shown in FIG. 5. The present invention of placing plated-through holes at the end of each row of hole mountings for an integrated circuit is applicable to greater or fewer than seven leads per row.

As printed wiring board 40 is drawn through the wave solder machinery, a solder bridge is formed between solder hole 41 and plated-through hole 39 and similarly between solder hole 41' and plated-through hole 39'. Plated-through holes 39 and 39' are aligned at the end of each row of solder holes 41, 41' and 42 through 53 and askew with respect to each of the rows formed by the solder holes. As a result, when solder is drawn from solder holes 41 and 41' to plated-through holes 39 and 39', bridging between solder holes 41 and 41' with other holes 42 and 43 is inhibited and simultaneously electrical connection is made between the integrated circuit leads connected to solder holes 41 and 41' with other layers or surfaces (not shown) of PWB 40. In addition, since the plated-through holes 39 and 39' are askew from the solder holes, they are outside the "footprint" of the integrated circuit and may also be used as test points to test the functionality of the circuit. In addition, since plated-through holes 39 and 39' are askew from the rows of solder holes, this permits integrated circuits to be more densely packaged upon the PWB 40.

Figure 6:
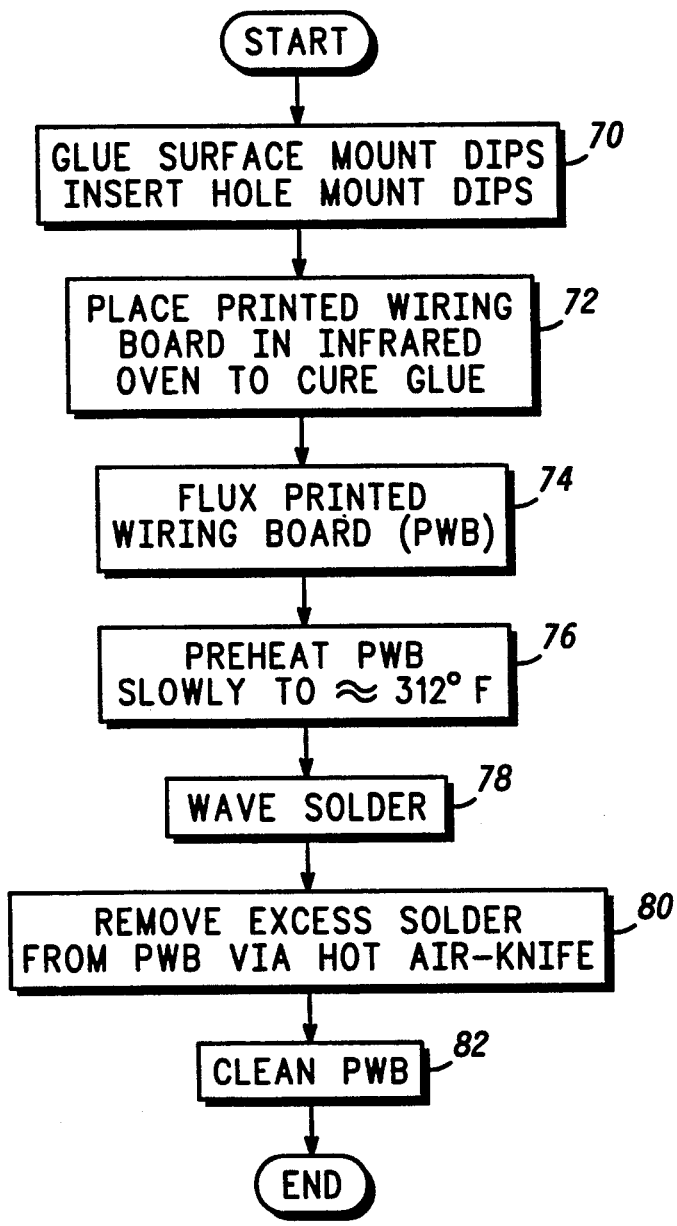
FIG. 6 is a flow chart of the processing of printed wiring cards in accordance with the present invention.

FIG. 6 depicts the process for wave soldering for eliminating solder bridges between leads of components of an integrated circuit while simultaneously connecting leads of an integrated circuit to other layers or surfaces of a printed wiring board. The process requires wave solder machinery 35 as shown in FIG. 2 commonly used in the industry such as the kind manufactured by the Hollis Company or Electrovert Inc. Referring to FIG. 6, the process is started and block 70 is entered. For integrated circuits which are surface-mount type, dual in-line packages (DIPs), they are glued by placing a number of glued dots on the corresponding integrated circuit location of the PWB. For hole-mounted DIPs, the leads of the DIP are inserted into appropriate holes through the PWB, block 70. Printed wiring boards which include surface mounted components with glue are placed in an infrared oven in order to rapidly cure the glue which provides for physical bonding of the surface-mounted integrated circuit to the PWB, block 72.

Next, the printed wiring board and attached components (PWB assembly) are fluxed or cleaned in preparation for soldering, block 74. For the fluxing operation, typically rosin mildly activated (RMA) flux is used. A "no-clean" flux may also be employed. The advantage of the "no-clean" flux is that the cleaning step after soldering is not required. Next, the printed wiring board with attached integrated circuits is preheated slowly to approximately 312° F., block 76. The preheating avoids thermal shock and damage to the PWB and integrated circuits during the wave soldering process. The PWB assembly is heated slowly at a rate of typically 39° F. per second. The slow heating also avoids thermal shock and damage to the PWB assembly Then the PWB assembly is wave soldered with molten solder, block 78. It is during the wave soldering process that the solder waves of the wave solder machine cause the bridging problems, but for the plated-through holes which draw the solder from forming bridges between the leads of the solder pads. The present process avoids solder bridges while making electrical contact from the last leads of the integrated circuit via the plated-through hole to other layers or surfaces of the PWB.

Next, the excess solder is removed from the PWB assembly, block 80. The excess solder removal is accomplished by a "air-knife". As the PWB assembly emerges from the wave soldering, the air-knife blows 400° C. air over the PWB assembly. The air-knife forces hot air over the solder assembly PWB at pressures from 5 to 20 PSI. The "air-knife" is a source of the solder bridges between leads of the integrated circuits, but for the plated-through holes. Lastly, if RMA flux was used, the PWB assembly must be cleaned, block 82. Typically Freon TM is used to clean the PWB. However, Freon TM contains CFC's which are harmful to the environment. In response to the environmental harm caused by Freon TM, water or turpine or a mixture of both may be used to clean the PWBs.

A novel interconnect and solder thief scheme has been shown. The reader should appreciate the advantages of this novel scheme as being the prevention of solder bridges between leads of integrated circuits while simultaneously forming electrical interconnection via plated-through holes to other layers or surfaces of the PWB. In addition, since the plated-through holes are askew from the lead rows of the integrated circuit, the plated-through holes may function as test points to test the functionality of the integrated circuit. In addition, since the plated-through holes are askew from the rows of integrated circuit leads, they permit printed wiring boards to be more densely packaged or populated with integrated circuits.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A printed wiring board comprising:
    a plurality of solder pads for establishing electrical interconnections and located on at least one surface of said printed wiring board and aligned to form at least one row of solder pads; and
    a plated-through hole located between said surface and another surface of said printed wiring board, said plated-through hole for drawing solder from at least one of said plurality of solder pads, said plated-through hole located at a first end of said row of solder pads and being substantially askew with respect to said row of solder pads, said plated-through hole being solder connected to one of said plurality of solder pads for inhibiting solder bridges among said plurality of solder pads for electrically interconnecting said one of said plurality of solder pads and other layers or surfaces of said printed wiring board via said plated-through hole.

2. A printed wiring board as claimed in claim 1, wherein said at least one row of solder pads includes two rows of solder pads arranged in parallel rows to electrically contact a dual in-line package surface-mount integrated circuit, each row of said solder pads having said plated-through hole at said first end of said row and askew to said row.

3. A printed wiring board as claimed in claim 1, wherein each of said plurality of solder pads includes a hole formed substantially in the center of each solder pad.

4. A printed wiring board as claimed in claim 3, wherein said at least one row of solder pads includes two rows of solder pads arranged in parallel rows to electrically contact a dual in-line package hole-mount integrated circuit, each row of said solder pads having a plated-through hole at said first end of said row and askew to said row.

5. A printed wiring board as claimed in claim 1, wherein there is further included wave solder means for providing molten solder, said printed wiring board being passed through said molten solder for forming a solder connection between said plated-through hole and a solder pad nearest to said plated-through hole.

6. A printed wiring board as claimed in claim 1, wherein there is further included pluralities of said plurality of solder pads located on said printed wiring board, each of said plurality of pluralities of solder pads located on said surface of said printed wiring board and having said plated-through hole at said first end of each said row of solder pads, each of said plurality of pluralities adapted for interconnecting one of a plurality of integrated circuits.

7. A printed wiring board assembly comprising:
    a printed wiring board;
    a plurality of insulated solder pads for establishing electrical interconnections and located on at least one surface of the printed wiring board, said plurality of solder pads being aligned in at least one row;
    a plated-through hole located at a first end of said row of solder pads, said plated-through hole for drawing solder from at least one of said plurality of solder pads, said plated-through hole being substantially askew from each said row of solder pads and in proximity to one of said solder pads;
    an integrated circuit including a plurality of leads formed in at least one row, each of the plurality of leads being placed in physical contact with a corresponding row of solder pads; and means for wave soldering said leads of said integrated circuit respectively to corresponding ones of said row of solder pads for making electrical connection therebetween, said wave solder means for simultaneously soldering said leads of said integrated circuit to said solder pads while inhibiting solder bridges between said leads of said integrated circuit, and said wave solder means simultaneously making an electrical connection between said plated-through hole and said one of said plurality of said solder pads for electrically interconnecting said one solder pad to other layers or surfaces of said printed wiring board.

8. A printed wiring board assembly as claimed in claim 7, wherein said at least one row of solder pads includes two rows of solder pads arranged in parallel to electrically contact a dual in-line package surface-mount integrated circuit, each row of said solder pads having a plated-through hole at said first end of said row of said solder pads and askew to said row.

9. A printed wiring board assembly as claimed in claim 7, wherein each of said plurality of solder pads includes a hole formed substantially in the center of each solder pad.

10. A printed wiring board assembly as claimed in claim 9, wherein said at least one row of solder pads includes two rows of solder pads arranged in parallel rows to electrically contact a dual in-line package hole-mount integrated circuit, each row of said solder pads having a plated-through hole at said first end of said row and askew to said row.

11. A printed wiring board assembly as claimed in claim 7, wherein there is further included pluralities of said plurality of solder pads located on said printed wiring board, each of said plurality of pluralities of solder pads located on said surface of said printed wiring board and having said plated-through hole at said first end of each said row of solder pads, each of said plurality of pluralities adapted for interconnecting one of a plurality of integrated circuits.

12. A printed wiring board assembly as claimed in claim 7, wherein said plated-through hole comprises a test point for testing the functionality of said integrated circuit, said means for wave solder filling-in said plated-through hole to provide said test point.

* * * * *